US008248577B2

(12) United States Patent
Streefkerk et al.

(10) Patent No.: US 8,248,577 B2
(45) Date of Patent: Aug. 21, 2012

(54) LITHOGRAPHIC APPARATUS AND DEVICE MANUFACTURING METHOD

(75) Inventors: Bob Streefkerk, Tilburg (NL); Sjoerd Nicolaas Lambertus Donders, 's-Hertogenbosch (NL); Roelof Frederik De Graaf, Veldhoven (NL); Christiaan Alexander Hoogendam, Veldhoven (NL); Hans Jansen, Eindhoven (NL); Martinus Hendrikus Antonius Leenders, Rotterdam (NL); Paulus Martinus Maria Liebregts, Veldhoven (NL); Jeroen Johannes Sophia M. Mertens, Duizel (NL); Jan-Gerard Cornelis Van Der Toorn, Eindhoven (NL); Michel Riepen, Bergschenhoek (NL)

(73) Assignee: ASML Netherlands B.V., Veldhoven (NL)

( * ) Notice: Subject to any disclaimer, the term of this patent is extended or adjusted under 35 U.S.C. 154(b) by 304 days.

(21) Appl. No.: 11/120,186

(22) Filed: May 3, 2005

(65) Prior Publication Data
US 2006/0250601 A1 Nov. 9, 2006

(51) Int. Cl.
G03B 27/52 (2006.01)
G03B 27/42 (2006.01)
(52) U.S. Cl. ............................. 355/30; 355/52
(58) Field of Classification Search .................... 355/30, 355/53, 77, 55, 72–75, 67–71; 250/548
See application file for complete search history.

(56) References Cited

U.S. PATENT DOCUMENTS

| 3,573,975 | A | 4/1971 | Dhaka et al. ............... 117/212 |
| 3,648,587 | A | 3/1972 | Stevens ..................... 95/44 |
| 4,346,164 | A | 8/1982 | Tabarelli et al. ............ 430/311 |
| 4,390,273 | A | 6/1983 | Loebach et al. ............. 355/125 |
| 4,396,705 | A | 8/1983 | Akeyama et al. ............ 430/326 |
| 4,480,910 | A | 11/1984 | Takanashi et al. ............ 355/30 |
| 4,509,852 | A | 4/1985 | Tabarelli et al. ............ 355/30 |
| 5,040,020 | A | 8/1991 | Rauschenbach et al. ....... 355/53 |
| 5,121,256 | A | 6/1992 | Corle et al. ................ 359/664 |
| 5,298,939 | A * | 3/1994 | Swanson et al. ............ 355/53 |
| 5,610,683 | A | 3/1997 | Takahashi ................. 355/53 |
| 5,825,043 | A | 10/1998 | Suwa ...................... 250/548 |

(Continued)

FOREIGN PATENT DOCUMENTS

DE 206 607 2/1984

(Continued)

OTHER PUBLICATIONS

European Search Report issued for European Patent Application No. 06252237.0-2222, dated Apr. 17, 2007.

(Continued)

*Primary Examiner* — Hung Henry Nguyen
(74) *Attorney, Agent, or Firm* — Pillsbury Winthrop Shaw Pittman LLP

(57) ABSTRACT

An immersion lithographic apparatus is provided with a liquid confinement structure which defines at least in part a space configured to contain liquid between the projection system and the substrate. In order to reduce the crossing of the edge of the substrate which is being imaged (which can lead to inclusion of bubbles in the immersion liquid), the cross-sectional area of the space in a plane parallel to the substrate is made as small as possible. The smallest theoretical size is the size of the target portion which is imaged by the projection system. In an embodiment, the shape of a final element of the projection system is also changed to have a similar size and/or shape in a cross-section parallel to the substrate to that of the target portion.

28 Claims, 5 Drawing Sheets

U.S. PATENT DOCUMENTS

| | | | |
|---|---|---|---|
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 7,256,868 B2 * | 8/2007 | Akamatsu | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0125351 A1 | 7/2004 | Krautschik | |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0068639 A1 | 3/2005 | Pierrat et al. | 359/754 |
| 2005/0088635 A1 * | 4/2005 | Hoogendam et al. | 355/30 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 * | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2006/0244938 A1 * | 11/2006 | Schuster | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 670 038 A1 | 6/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-093997 | 4/2005 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/020298 A1 | 3/2005 |
| WO | WO 2005/024517 | 3/2005 |
| WO | 2005/034174 A2 | 4/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\Lambda$/NA scaling equations for resolution, depth of focus, and immersion lithography, *J. Microlith., Microfab., Microsyst.* 1(1):7-12 (2002).

European Office Action for European Application No. 07 013 766.6 dated Apr. 23, 2009.

Notice of Reasons for Rejection for Japanese Patent Application No. 2006-123549 dated. Jul. 22, 2009.

Chinese Office Action for Chinese Application No. 200810095615.1 dated Aug. 28, 2009.

Japanese Office Action mailed Apr. 6, 2012 in corresponding Japanese Patent Application No. 2009-243837.

* cited by examiner

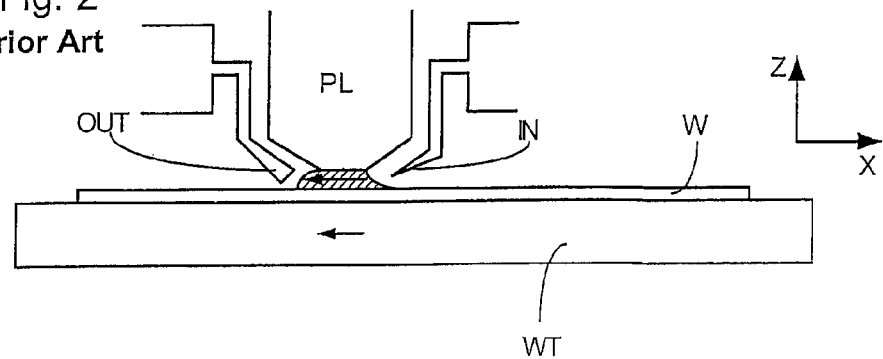
Fig. 2
Prior Art
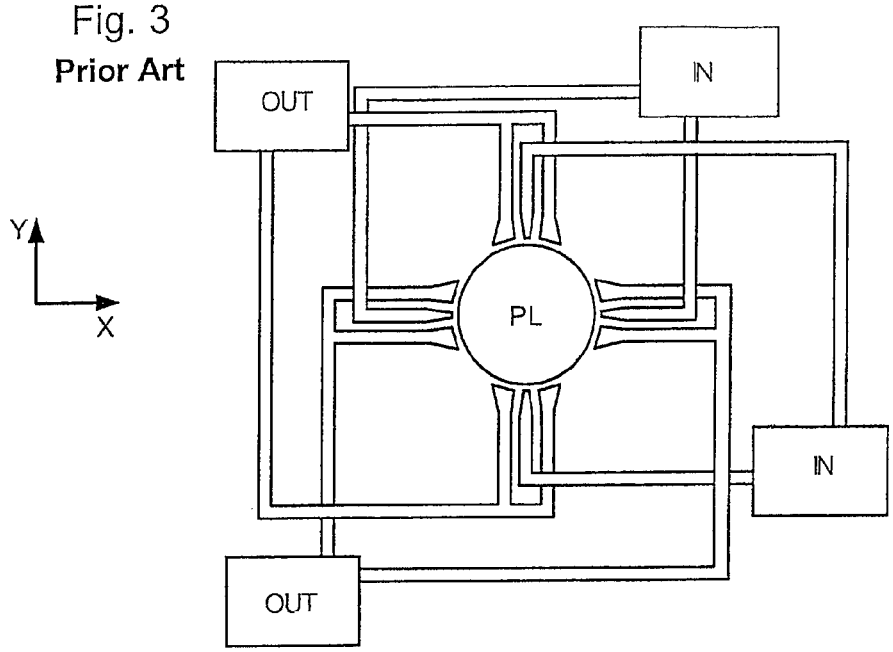
Fig. 3
Prior Art
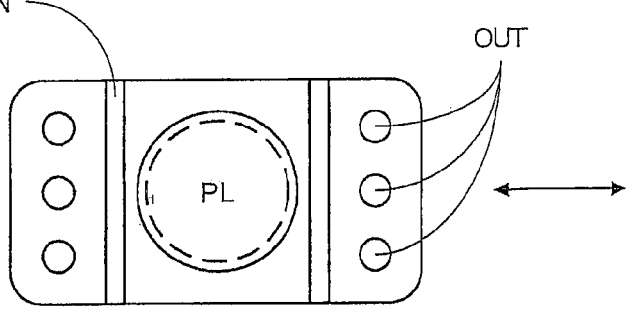
Fig. 4
Prior Art
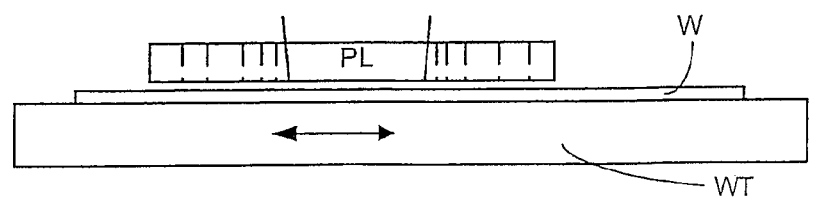

PB

100

60

70

LITHOGRAPHIC APPARATUS AND DEVICE MANUFACTURING METHOD

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate It has been proposed to immerse the substrate in the lithographic projection apparatus in a liquid having a relatively high refractive index, e.g. water, so as to fill a space between the final element (e.g., a lens, another optical element, or other structure) of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The presence of bubbles in the immersion liquid of an immersion lithography apparatus may deleteriously affect the imaging quality and evaporation of immersion liquid from the substrate which can lead to overlay errors, problems with focus control and drying stains.

Accordingly, it would be advantageous, for example, to reduce bubble formation in and evaporation of the immersion liquid.

According to an aspect of the invention, there is provided a lithographic apparatus comprising:

a substrate table constructed to hold a substrate; and a projection system configured to project a patterned radiation beam onto a target portion of the substrate and having an element immediately adjacent the substrate, the element having a cross-sectional shape in a plane substantially parallel to the substrate which is rectilinear.

According to an aspect of the invention, there is provided a lithographic apparatus, comprising:

a substrate table constructed to hold a substrate;

a projection system configured to project a patterned radiation beam onto a target portion of the substrate; and a liquid confinement structure having a surface defining at least in part a space configured to contain liquid between the projection system and the substrate, wherein in a plane substantially parallel to the substrate, at a position closest to the substrate, the space has a cross-section which substantially conforms in shape, area, or both to that of the target portion.

According to an aspect of the invention, there is provided a lithographic apparatus, comprising:

a substrate table constructed to hold a substrate;

a projection system configured to project a patterned radiation beam onto a target portion of the substrate; and a liquid confinement structure having a surface defining at least in part a space configured to contain liquid between the substrate and an element of the projection system immediately adjacent the substrate, wherein in a plane substantially parallel to the substrate an area, a shape, or both of the cross-section of the element, of the space, or both, substantially conform(s) to that of the target portion.

According to an aspect of the invention, there is provided a device manufacturing method comprising using a projection system to project on a target portion of a substrate a patterned beam of radiation, wherein an element of the projection system immediately adjacent the substrate has a cross-sectional shape in a plane substantially parallel to the substrate which is rectilinear.

According to an aspect of the invention, there is provided a device manufacturing method comprising using a projection system to project on a target portion of a substrate a patterned beam of radiation, wherein a space configured to be filled with liquid between the projection system and the substrate is defined at least in part by a surface of a liquid confinement structure and wherein in a plane substantially parallel to the substrate at a position closest to the substrate the space has a cross-section which substantially conforms in shape, area, or both to that of the target portion.

According to an aspect of the invention, there is provided a device manufacturing method comprising using a projection system to project on a target portion of a substrate a patterned beam of radiation, wherein a liquid is provided in a space between the projection system and the substrate and which space is defined at least in part by a surface of a liquid confinement structure and the space, an element of the projection system immediately adjacent the substrate, or both, has a cross-section in a plane substantially parallel to the substrate which conforms closely in size, shape, or both to that of the target portion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
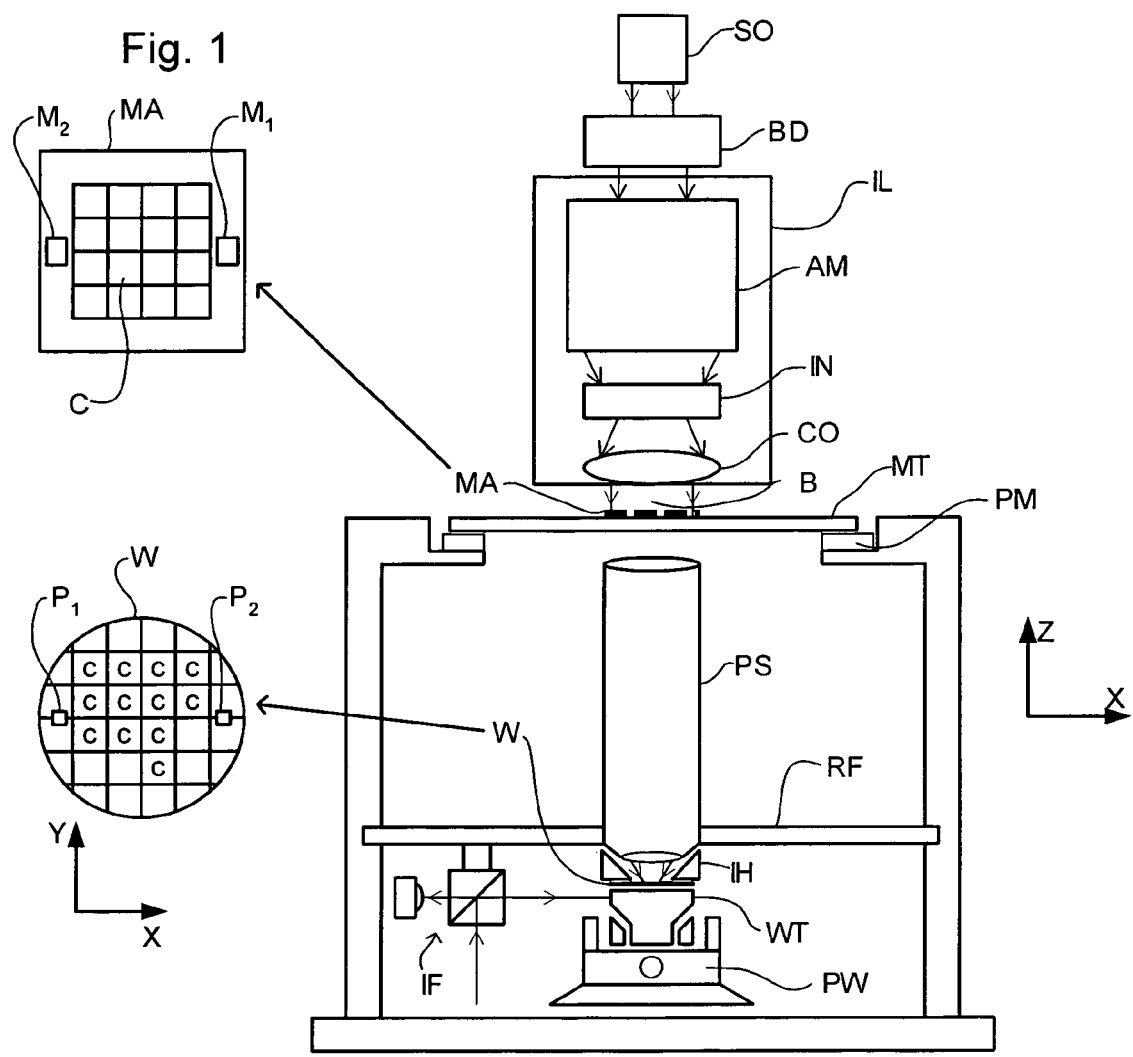
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
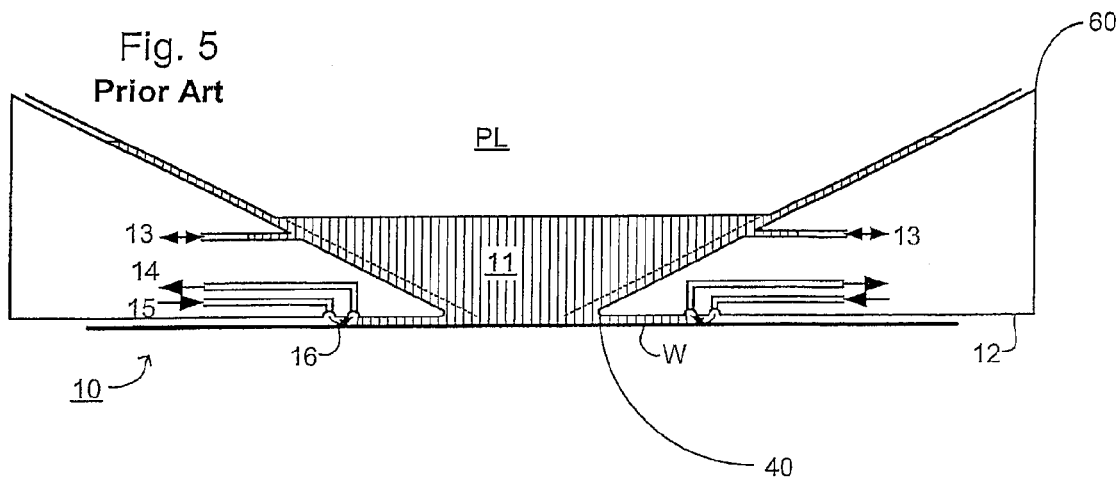
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. In an embodiment, the seal is a contactless seal such as a gas seal. Such a system is disclosed in United States patent application publication no. US 2004-0207824 and European patent application publication no. EP 1420298, each hereby incorporated in its entirety by reference, and illustrated in FIG. 5.

Figure 6:
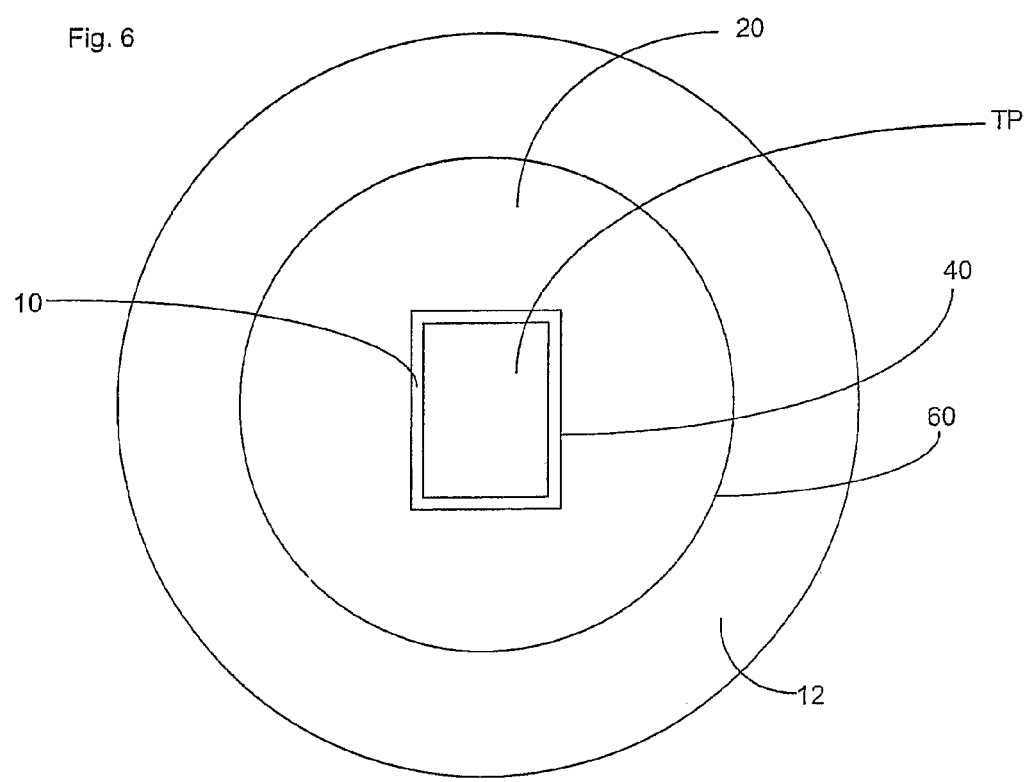
FIG. 6 depicts schematically in plan a space of a liquid confinement structure in accordance with an embodiment of the invention.
Figure 7:
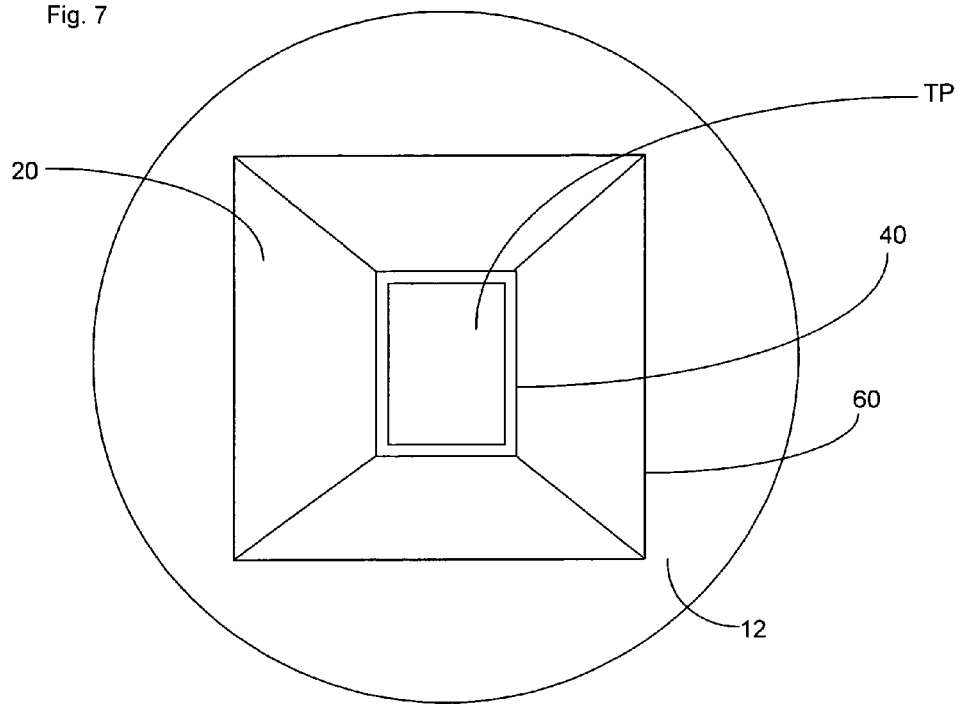
FIG. 7 depicts schematically in plan a space of another liquid confinement structure in accordance with an embodiment of the invention.
Figure 8:
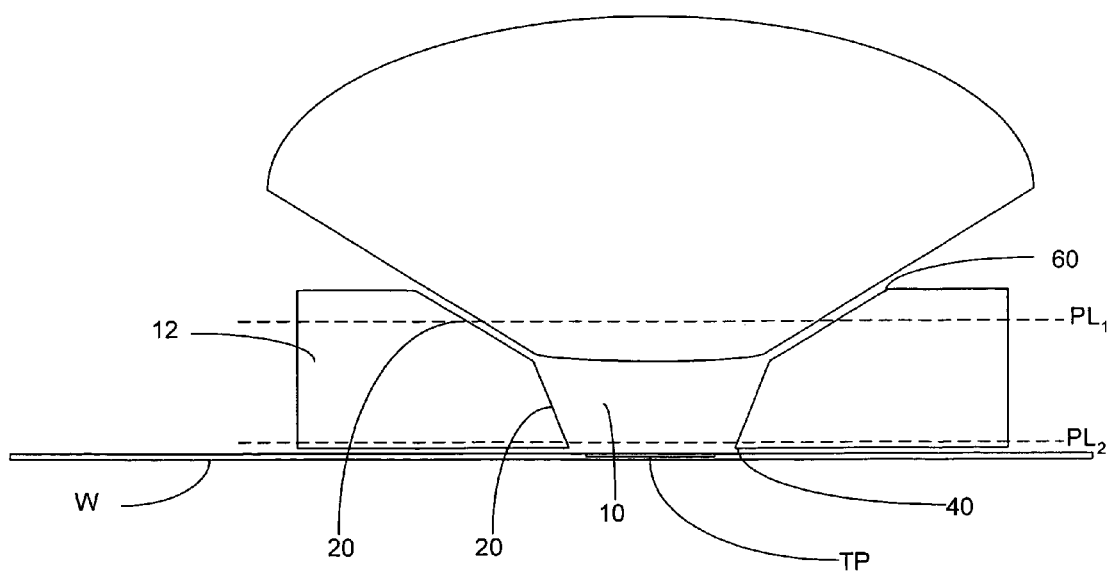
FIG. 8 depicts in cross-section a liquid confinement structure and a final element of the projection system according to the invention.
Figure 9:
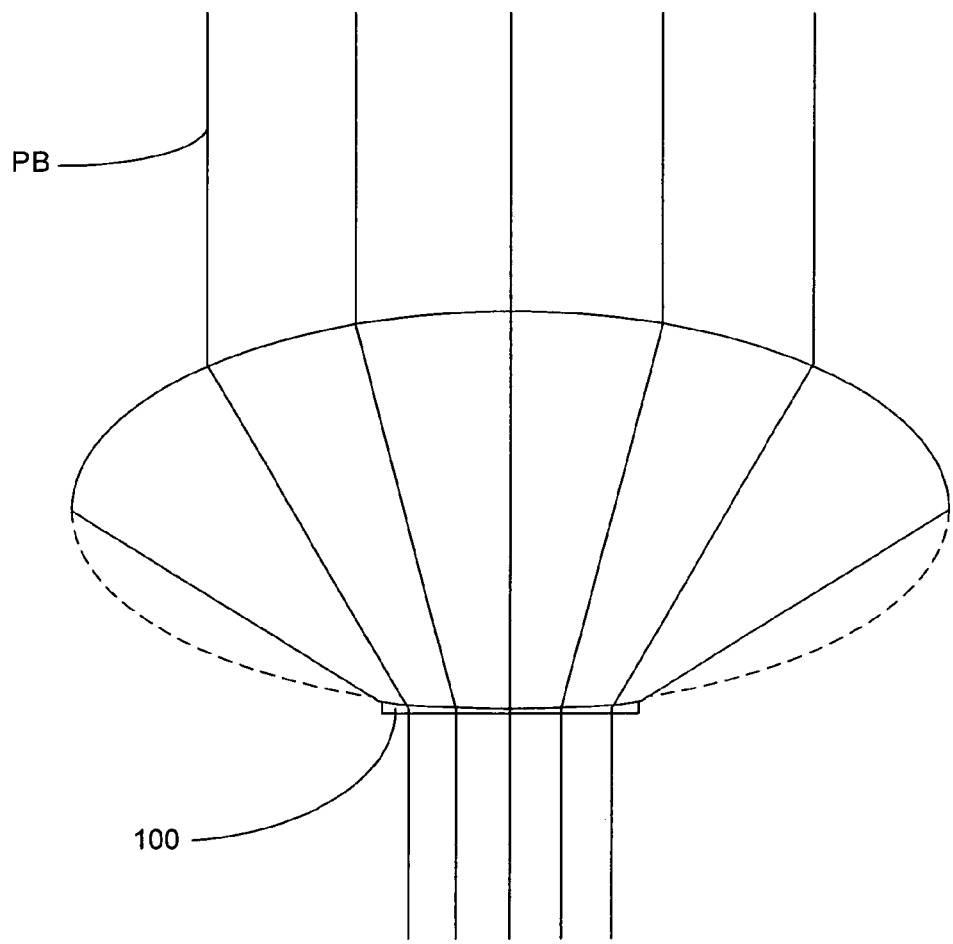
FIG. 9 depicts in cross-section a final element of the projection system.
Figure 10:
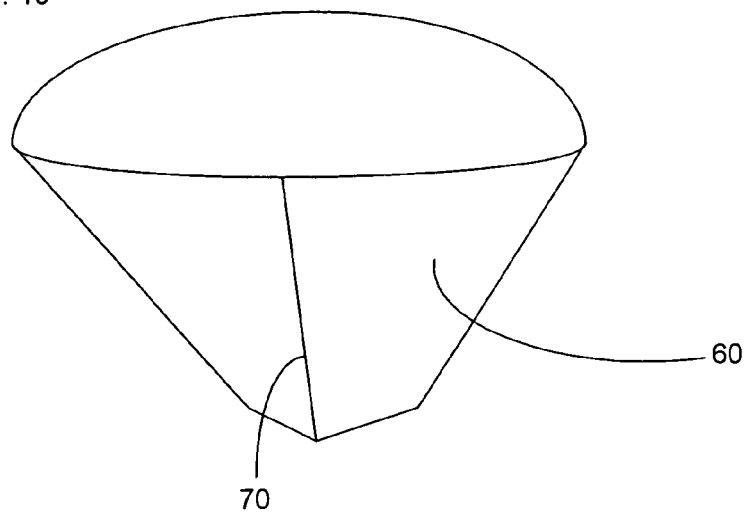
FIG. 10 depicts schematically the final element of FIG. 9.

The size and shape of the target portion C (which is sometimes referred to as the slit size) can be determined by the illumination optics, such as a quartz rod which is a light mixer and/or a masking unit which is positioned near to the exit of this rod Bubbles may be formed in the immersion liquid due to movement of the substrate W and substrate table WT beneath the projection system PL and the substantially stationary liquid confinement system such as that illustrated in FIG. 4 or FIG. 5. In particular, when an edge of the substrate W passes under the space occupied by immersion liquid 11, bubbles may be formed in the immersion liquid and thereby reduce the imaging quality of the apparatus Liquid confinement systems have been typically designed for use with conventional projection systems PL. In such systems, the last element tends to have a circular cross-section in a plane substantially perpendicular to the optical axis of the projection system (which is the same as a plane substantially parallel to the substrate W). In order for the liquid confinement systems to operate, the cross-sectional area of the space filled with liquid closely conforms to the shape of the final element of the projection system in one and the same plane. This is designed to be the case to maximize the available space for the liquid supply system which requires many components in a small volume. Several different designs of liquid confinement system have been proposed. One or more embodiments of the invention are applicable to all of those different designs including but not limited to those disclosed in United States patent publication no. US 2004-0263809, PCT patent application publication no. WO 2004-090634, European patent application publication nos. EP 1420298, EP 1494079, and EP 1477856, and U.S. patent application Ser. No. 11/098,615, filed 5 Apr. 2005, the contents of each of which are incorporated in their entirety herein by reference The liquid confinement structure illustrated in FIG. 5 is now described in detail. However, one or more embodiments of the invention are not limited in application to this type of liquid confinement structure FIG. 5 shows a liquid reservoir or space 10 between the projection system and the substrate stage. The space 10 is filled with a liquid 11 having a relatively high refractive index, e.g. water, provided via inlet/outlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field A contactless seal to the substrate around the image field of the projection system is formal so that liquid is confined in the space 10 between the substrate surface and the final element of the projection system. The space is formed or defined by a liquid confinement structure 12 positioned below and surrounding the final element of the projection system PL. Liquid is brought into the space 10 below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the step of the projection system or the final element thereof and may, e.g., be round The liquid is confined in the space 10 by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid Other types of liquid confinement structure 12 may be used. For example, the gas seal may be replaced by a combination of a single phase extractor, a recess and a gas knife as is described in U.S. patent application Ser. No. 11/098,615, filed 5 Apr. 2005, hereby incorporated in its entirety by reference herein. Alternatively, a gas seal may be replaced by a hydrostatic or hydrodynamic bearing as is described in U.S. patent application publication no. US 2005-0181.55, each of which are hereby incorporated in their entirety by reference In order to reduce or minimize the amount of time which the space 10 occupied by liquid spends over an edge of the substrate W during scanning and to reduce or minimize the area of the top surface of the substrate from which immersion liquid may evaporate, the cross-section of the space 10 in a plane parallel to the top surface of the substrate W at a position closest to the substrate, is fashioned to conform closely to the shape of the target portion TP (sometimes referred to as the illumination slit area). This is illustrated in FIG. 6. As can be seen from FIG. 6, which is an illustration of the liquid confinement structure 12 in plan, the space 10 is defined by walls 20 extending between a lower opening 40 of the space 10 in the lower surface of the liquid confinement structure 12 and an upper opening 60 in the upper surface of the liquid confinement structure 12. In FIG. 6, the upper opening 60 is circular such that the liquid confinement structure 12 may be used with a conventional projection system PL in which the final element of the projection system is radially symmetric and the bottom opening 40 which is closest to the substrate W is rectangular and conforms in shape closely to the shape of the target portion TP. Furthermore, the lower opening 40 also closely conforms in size to that of the target portion TP though of course it cannot be smaller than the target portion TP. In an embodiment, the area of the lower opening 40 or of the cross-section of the space in a plane substantially parallel to the substrate W at a position closest to the substrate W is less than 1.5 times the area of the target portion TP, in an embodiment less than 1.4, 1.3, 1.2 or 1.1 times the area of the target portion TP. This difference is to account for relative movement of the liquid supply system to the final element either in the case of 'play' or so that the movement can be deliberately carried out The surface 20 of the liquid confinement structure 12 which defines the space 10 in which the liquid is confined is shaped to transfer smoothly from the shape of the upper opening 60 to the lower opening 40 and accommodates the shape of the final element of the projection system and allows some relative movement of the confinement system as is described in European patent application publication no. EP 1477856, the contents of which is hereby incorporated in its entirety by reference. However, such a transfer can result in difficulties in the flow conditions and so, in an embodiment, the shapes of the upper and lower openings, 40,60 are similar, at least both rectilinear. This is particularly easy to arrange for if the projection system is close to the substrate. The further the projection system is from the substrate the more circular the projection system bottom needs to be because of the greater angles (there tend to be more pupil shapes). A rectilinear situation is illustrated in FIG. 7 in which the upper opening 60 is square and the lower opening 40 is rectangular. In this arrangement, it should be easy to achieve parallel flow of immersion liquid across the target portion TP without re-circulation of immersion liquid. Re-circulation of immersion liquid is to be avoided because re-circulated immersion liquid may be heated up by the projection beam PB more than non-re-circulated immersion liquid and the variation in temperature can lead to variations in refractive index of the immersion liquid in the space If the size of the lower opening 40 of the space in the liquid confinement structure 12 is reduced or minimized as is illustrated in FIGS. 6 and 7 by making its cross-sectional shape and/or size conform closely or be similar to that of the target portion TP, during scanning of a whole substrate W the number of scans in which the opening 40 passes over an edge of the substrate is greatly reduced. Thus, the opportunity for bubble formation in the immersion liquid in the space 10 due to passing over of the edge of the substrate is reduced and so is the area from which immersion liquid can evaporate FIGS. 8-10 illustrate an embodiment of the invention in which both the final element of the projection system and the liquid confinement structure 12 are optimized in shape and geometry so that the size of the lower opening 40 can be made to closely conform to the shape and/or size of the target portion TP without deleteriously affecting other operating conditions such as the ability to generate parallel flow of immersion liquid across the target portion TP or reducing the available volume for the liquid supply system. Indeed, this embodiment may increase available volume for the liquid supply system over prior systems In FIG. 8, a liquid confinement structure 12 similar to that illustrated in FIG. 7 is used. Thus, the lower opening 40 of the space is of a similar shape and dimension to the target portion TP in a plane $PL_2$ which is substantially parallel to the substrate W and adjacent the substrate W, e.g., at a position closest to the substrate W. As is illustrated, the liquid confinement structure 12 partly surrounds the final element of the projection system PL. Thus, a plane $PL_1$ exists which is substantially parallel to the plane of the top surface of the substrate W and also intersects both the space 10 defined by the liquid confinement structure 12 and the lower end of the final element of the projection system PL. In this plane, the cross-sectional shape and size of the space is similar to that of the cross-sectional shape and size of the final element of the projection system PL. Thus, in contrast to the final element of the projection system which would be used with the liquid confinement structure 12 of FIG. 6, the final element of the projection system PL is shaped such that it also has a rectangular or square cross-section in that plane so that it is possible for the inner surface of the liquid confinement structure 12 which defines the space to transfer in shape from the lower opening 40 to the upper opening 60 without needing to convert straight lines to curved lines. This helps in the establishment of parallel flow of immersion liquid across the target portion TP and simplifies the shaping of walls 20. As the distance between the projection system and the substrate increases, the importance of a homogeneous immersion liquid increases so that parallel flow is even more desirable. The walls 20 are all substantially flat. In an embodiment, the shape of the lower opening and upper opening, and thereby the shape of the cross-section of the final element of the projection system PL, are similar to the shape of the target portion In FIG. 8, a space 10 is illustrated which has a cross-section in a plane substantially parallel to the substrate W which decreases as the substrate W is approached. This need not necessarily be the case and it may be that the upper and lower openings 40, 60 are the same or substantially the same size so that the side walls of the space defined by the liquid confinement structure 12 are parallel in cross-section. As is illustrated in FIG. 8, the rate of increase/decrease in cross-sectional area as the substrate W is left/approached is not necessarily constant and a space 10 with two gradients of inner side wall 20 is provided, a steep gradient between the substrate 20 and substantially the bottom of the projection system and another shallower gradient above that FIG. 9 illustrates a final element of the projection system. The dotted lines show the shape of a typical final element of a projection system and it can be seen that those parts of the final element can be removed without affecting the optical properties of the final element in use. Machining away the areas shown in dotted lines is one way of manufacturing such an element. Thus, the bottom surface of the final element is a shape to which the space of the liquid confinement structure 12 can be closely formed without the need to use a curved upper opening 60. The very bottom of the final element is illustrated as having a coating 100 applied to it (or a quartz plate or so-called abslussplatte 100). The coating or quartz plate 100 is shown as being flat. However, this need not be the case and the very bottom surface of the final element may be curved and may or may not have a coating or quartz plate applied to it FIG. 10 is a three dimensional illustration of the final element of the projection system in which the transition from a curved upper surface to a non-curved lower surface is clearly seen. The top half of the element is normally shaped and it is the bottom half of the element which has flat sides joined by straight edges 70 i.e. has a rectilinear cross-sectional shape in a plane substantially parallel to the substrate W An embodiment of the invention is also applicable to off axis projection systems in which the projection beam is arranged such that the target portion is not, in plan, centered under the middle of the projection system In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a substrate table constructed to hold a substrate;
   a projection system configured to project a patterned radiation beam onto a target portion of a surface of the substrate; and
   a liquid confinement structure configured to contain liquid in a space between the nearest point, to the substrate, of an optical surface of the projection system and a bottom surface of the liquid confinement structure, the projection system optical surface, in use, contacting the liquid and having the patterned radiation beam pass through the optical surface,
   the liquid confinement structure having a further surface extending between the substrate and the nearest point of the optical surface, at least part of the further liquid confinement structure surface being at an angle with respect to the surface of the substrate, and the further liquid confinement structure surface at least in part defining the space laterally between the bottom surface of the liquid confinement structure and the nearest point of the projection system optical surface,
   wherein in a plane substantially parallel to the substrate and passing through the further liquid confinement structure surface, at a position closest to the substrate, the space has a cross-section having an area which is less than 1.5 times the area of the target portion, and
   wherein in a plane substantially parallel to the substrate and which intersects both the liquid confinement structure and a final element of the projection system, the periphery of the cross-section of the final element is substantially evenly surrounded by an inner periphery of the liquid confinement structure.

2. The apparatus according to claim 1, wherein the final element of the projection system has a cross-section in a plane substantially parallel to the substrate which substantially conforms in shape to the shape of the target portion, the cross-section of the space, or both.

3. The apparatus according to claim 1, wherein the target portion is substantially rectangular.

4. A lithographic apparatus, comprising:
   a substrate table constructed to hold a substrate;
   a projection system configured to project a patterned radiation beam onto a target portion of the substrate; and
   a liquid confinement structure configured to contain liquid in a space between a bottom surface of the liquid confinement structure and an element of the projection system immediately adjacent the substrate, the liquid confinement structure having a further surface extending between the substrate and the nearest point of an optical surface of the element to the substrate, the element optical surface, in use, contacting the liquid and having the patterned radiation beam pass through the optical surface, and the further liquid confinement structure surface at least in part defining the space laterally between the bottom surface of the liquid confinement structure and the nearest point of the element optical surface,
   wherein the cross-sectional geometrical shape of the space in a plane substantially parallel to the substrate changes from a first geometrical shape at a position furthest from the substrate to a second geometrical shape, that is not merely a uniform scaling of the first geometrical shape, at a position closest to the substrate, wherein at the position closest to the substrate the geometrical cross-sectional shape, area, or both, of the space in a plane passing through the further liquid confinement structure surface is substantially the same as that of the target portion, and
   wherein in a plane substantially parallel to the substrate and which intersects both the liquid confinement structure and the element, the periphery of the cross-section of the element is substantially evenly surrounded by an inner periphery of the liquid confinement structure.

5. The apparatus according to claim 4, wherein the space is tapered such that the cross-sectional area of the space in a plane substantially parallel to the substrate reduces as the substrate is approached.

6. A device manufacturing method comprising using a projection system to project on a target portion of a surface of a substrate a patterned beam of radiation, wherein a space laterally between a bottom surface of a liquid confinement structure and the nearest point of an optical surface of the projection system to the substrate is configured to be filled with liquid and is defined at least in part by a further surface of the liquid confinement structure, the further liquid confinement structure surface extending between the substrate and the nearest point of the optical surface of the projection system to the substrate, the projection system optical surface, in use, contacting the liquid and having the patterned radiation beam pass through the optical surface, and at least part of the further liquid confinement structure surface extending between the substrate and the nearest point of the optical surface is at an angle with respect to the surface of the substrate, and
   in a plane substantially parallel to the substrate at a position closest to the substrate and passing through the liquid confinement structure surface, the space has a cross-section having an area which is less than 1.5 times the area of the target portion, and
   in a plane substantially parallel to the substrate and which intersects both the liquid confinement structure and an optical element of the projection system immediately adjacent the substrate, the periphery of the cross-section of the element is substantially evenly surrounded by an inner periphery of the liquid confinement structure.

7. A device manufacturing method comprising using a projection system to project, on a target portion of a substrate, a patterned beam of radiation, wherein a liquid is provided in a space laterally between a bottom surface of a liquid confinement structure and the nearest point of an optical element of the projection system immediately adjacent to the substrate and which space is defined at least in part by a further surface of the liquid confinement structure, the further liquid confinement structure surface extending between the substrate and the nearest point of the optical element of the projection system to the substrate, the element, in use, contacting the liquid and having the patterned radiation beam pass through the optical element, and wherein the cross-sectional geometrical shape of the space in a plane substantially parallel to the substrate changes from a first geometrical shape at a position furthest from the substrate to a second geometrical shape, that is not merely a uniform scaling of the first geometrical shape, at a position closest to the substrate, wherein at the position closest to the substrate the cross-sectional geometrical shape, area, or both, of the space in a plane passing through the further liquid confinement structure surface is substantially the same as that of the target portion and wherein in a plane substantially parallel to the substrate and which intersects both the liquid confinement structure and the element, the periphery of the cross-section of the element is substantially evenly surrounded by an inner periphery of the liquid confinement structure.

8. The apparatus according to claim 4, wherein the second geometrical shape has an area which is less than 1.5 times the area of the target portion.

9. The method according to claim 7, wherein the second geometrical shape has an area which is less than 1.5 times the area of the target portion.

10. The apparatus according to claim 4, wherein a shape of the element is square and the second geometrical shape is rectangular.

11. The apparatus according to claim 4, wherein a shape of the element and the second geometrical shape are rectangular.

12. The method according to claim 7, wherein a shape of the element is square and the second geometrical shape is rectangular.

13. The method according to claim 7, wherein a shape of the element and the second geometrical shape are rectangular.

14. The apparatus according to claim 1, wherein the space substantially conforms in shape to that of the target portion.

15. The apparatus according to claim 1, wherein at least a portion of the liquid confinement structure extends to within a boundary of contact of liquid, in use, on the projection system optical surface.

16. The apparatus according to claim 1, wherein, in use, there is both liquid between the liquid confinement structure and the substrate and between the projection system optical surface and at least a portion of the liquid confinement structure straight above liquid between the liquid confinement structure and the substrate.

17. The apparatus according to claim 1, further comprising a liquid inlet configured to supply liquid to between the projection system and the substrate at a location between a portion of the liquid confinement structure and the projection system optical surface that, in use, contacts the liquid.

18. The apparatus according to claim 17, further comprising a liquid outlet configured to remove liquid from between the projection system and the substrate after liquid has passed between a gap between the portion of the liquid confinement structure and the substrate.

19. The apparatus according to claim 1, wherein the liquid confinement structure surface extends along and around a boundary of the space and defines an opening facing the projection system and an opening facing the substrate, and wherein, in use, liquid flows from the opening facing the projection system toward the opening facing the substrate.

20. The apparatus according to claim 1, wherein the space is within the liquid confinement structure.

21. The method according to claim 6, wherein the space substantially conforms in shape to that of the target portion.

22. The method according to claim 6, wherein at least a portion of the liquid confinement structure extends to within a boundary of contact of liquid, in use, on the projection system optical surface.

23. The method according to claim 6, wherein, in use, there is both liquid between the liquid confinement structure and the substrate and between the projection system optical surface and at least a portion of the liquid confinement structure straight above liquid between the liquid confinement structure and the substrate.

24. The method according to claim 6, further comprising supplying liquid to between the projection system and the substrate at a location between a portion of the liquid confinement structure and the projection system optical surface that, in use, contacts the liquid.

25. The method according to claim 24, further comprising removing liquid from between the projection system and the substrate after liquid has passed between a gap between the portion of the liquid confinement structure and the substrate.

26. The method according to claim 6, wherein the liquid confinement structure surface extends along and around a boundary of the space and defines an opening facing the projection system and an opening facing the substrate, and wherein, in use, liquid flows from the opening facing the projection system toward the opening facing the substrate.

27. The apparatus according to claim 4, wherein in a plane substantially parallel to the substrate an area, a shape, or both of a cross-section of the element substantially conforms to that of the target portion.

28. The method according to claim 6, wherein the element has a cross-section in a plane substantially parallel to the substrate which conforms closely in size, shape, or both to that of the target portion.

* * * * *